United States Patent [19]

Cayrol

[11] 4,187,339
[45] Feb. 5, 1980

[54] PRINTED CIRCUITS

[76] Inventor: Pierre-Henri Cayrol, 20, Avenue Beauséjour, 77500 Chelles, France

[21] Appl. No.: 938,104

[22] Filed: Aug. 30, 1978

[30] Foreign Application Priority Data

Aug. 31, 1977 [FR] France ................ 77 27152

[51] Int. Cl.² .................... H05K 1/00; B32B 5/16
[52] U.S. Cl. .................... 428/208; 29/625; 174/68.5; 361/410; 361/411; 427/96; 427/282; 428/195; 428/204; 428/206; 428/209; 428/901
[58] Field of Search ............ 428/901, 195, 209, 208, 428/204, 206; 427/282, 96; 361/410, 411; 29/625; 174/68.5

[56] References Cited

U.S. PATENT DOCUMENTS

| | | | |
|---|---|---|---|
| 2,607,825 | 8/1952 | Eisler | 428/901 |
| 2,866,764 | 12/1958 | West | 427/96 |
| 2,893,150 | 7/1959 | Tann | 427/96 |
| 3,031,344 | 4/1962 | Sher | 428/206 |
| 3,330,695 | 7/1967 | Curran | 427/96 |
| 3,714,709 | 2/1973 | Liederbach | 427/96 |
| 3,798,059 | 3/1974 | Astle | 427/96 |
| 3,818,279 | 6/1974 | Seeger | 174/68.5 |
| 3,982,941 | 9/1976 | Inskip | 427/96 |
| 4,049,844 | 9/1977 | Bolon | 427/96 |
| 4,050,756 | 9/1977 | Moore | 428/901 |
| 4,118,595 | 10/1978 | Pfahnl | 427/96 |
| 4,123,565 | 10/1978 | Sumitomo | 427/96 |
| 4,141,055 | 2/1979 | Berry | 427/96 |

*Primary Examiner*—Ellis P. Robinson
*Attorney, Agent, or Firm*—Karl F. Ross

[57] ABSTRACT

A printed circuit has additional connections formed on one of its faces by depositing beads of conductive resin on that face. The conductive beads are covered by an insulating coating, and, if required, further conductive beads may be deposited on the insulating coating formed on the first beads.

4 Claims, 9 Drawing Figures

PRINTED CIRCUITS

BACKGROUND OF THE INVENTION

1. Field of the Invention

The invention relates to printed circuits.

2. Description of the Prior Art

Printed circuits are generally either single-faced, or double-faced, which facilitates interconnection. But certain complicated assemblies cannot be made even with a double-faced printed circuit, and it is necessary to provide the printed circuit with auxiliary connections.

These auxiliary connections may be achieved with a single wire, the ends of which are welded in the printed circuit holes to be connected. It is also possible to weld into these holes two pins with angular sections which are connected each with the other by wrapping a wire on these pins. It is also possible to effect the connection by means of a heat-weldable wire, i.e. a conductor wire coated with a heat-weldable enamel. In some cases the printed circuit has internally a number of wires which are insulated and are thus able to cross one another without detriment. It is sufficient to bore into the printed circuit holes facing the same wire and to metallize the holes; these holes are then, as a result, connected one with the other.

OBJECT OF THE INVENTION

The present invention has for its object a process for the production of a printed circuit, particularly those circuits in which two faces are not sufficient to provide all the necessary interconnections, the possibilities of which are considerable.

SUMMARY OF THE INVENTION

In a process according to the invention, connections are formed on one of the faces of a support, constituted by a printed circuit, by means of a conductive synthetic resin which is deposited as a bead on the said face and which is subsequently baked or otherwise hardened. These connections are coated with an insulating coating and further connections are possibly formed on the previous ones coated with the coating and therefore insulated from them. The printed circuit is provided with conductor holes and the connections connect some of these holes to others.

With this process it is possible to make as many connection layers as are required: the connections in different layers can cross one another as they are insulated from the adjacent layers.

The deposition of the conductive synthetic resin may be made by a silk screen or extrusion processes.

The invention also relates to a printed circuit with conductor holes, wherein beads of the conductive synthetic resin connect some of these holes, and are coated with an insulating coating.

BRIEF DESCRIPTION OF THE DRAWINGS

The invention will now be described, by way of example only, with reference to the accompanying diagrammatic drawings, in which.

DESCRIPTION OF THE PREFERRED EMBODIMENT

The printed circuit 1, which may have a multiplicity of layers has, passing through it, holes 2 which are metallized as indicated at 3. On one of the faces of the circuit (in the embodiment shown, the upper face) the metallized holes 2 are connected to foils or flakes 4 with which their coating is integral. The bottom face of the circuit 1 may be provided with connections produced in a standard manner.

Figure 1:
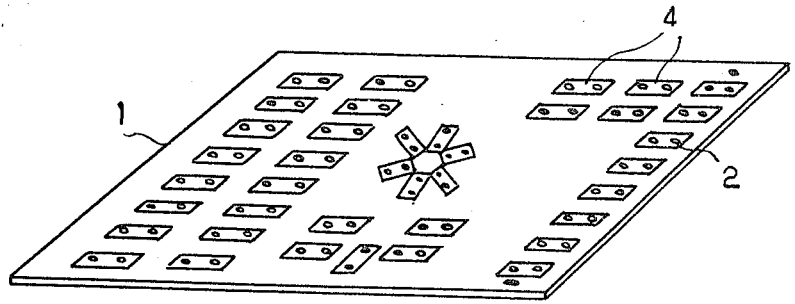
FIGS. 1 to 5 are perspective views of a printed circuit, at various stages of the process according to the invention.
Figure 2:
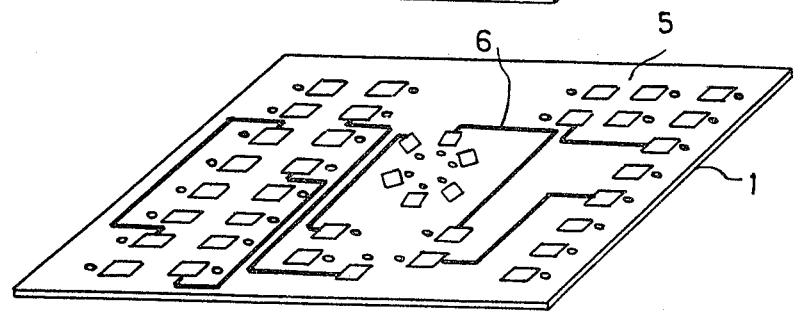

The circuit 1 is coated with an insulating layer 5, avoiding the holes 3 and the foils 4 (FIG. 2). Then, by a silk screen process, the deposition is made onto this insulating layer of beads of conductive resin so as to produce connections such as 6 between some of the foils 4; this resin may, for example, be a resin of the type sold under the trade name "Epo-Tek".

Figure 3:
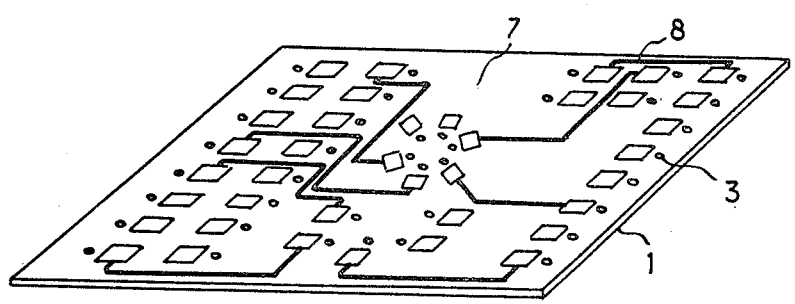
Figure 6:
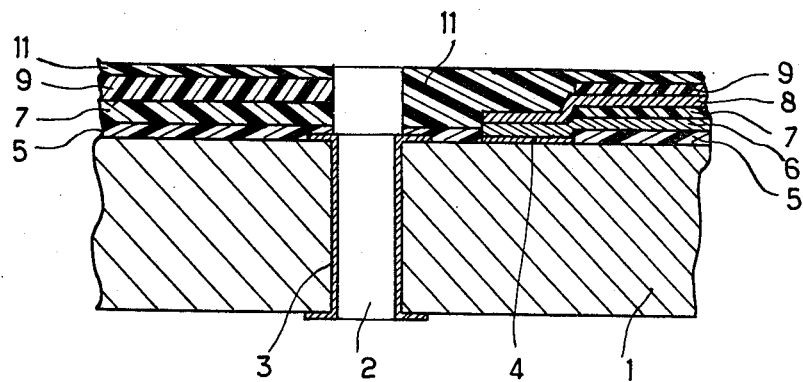
FIG. 6 is a cross-section of a detail of the finished printed circuit.

After baking or otherwise hardening the resin constituting the connections 6, the circuit 1 is coated with a second insulating layer 7, avoiding the holes 3 and all or some of the foils 4 (FIG. 3). By means of conductive resin, connections 8 are then made between some foils 4; these connections may, without detriment, overlap some of the connections 6 as they are separated from them by the insulating layer 7. Conversely, if it is desired that a connection 8 should be connected to a connection 6, it will be sufficient to arrange for these two connections to pass over one and the same foil 4, which was avoided when the layer 7 was formed, as represented in FIG. 6.

Figure 4:
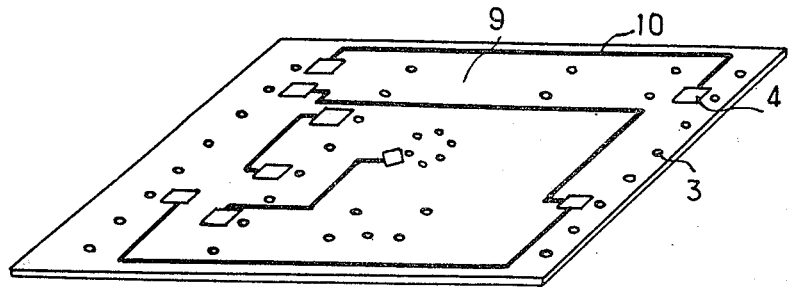
Figure 5:
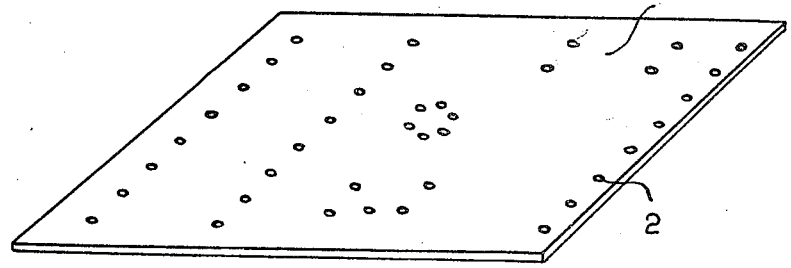

If this should be necessary, after baking the resin which forms the connections 8, the circuit is coated with an insulating layer 9 avoiding the holes 3 and the foils 4 between which connections have still to be made, and connections 10 are then formed between the remaining foils 4 (FIG. 4). Finally, the circuit is coated with one last insulating layer (FIG. 5).

The upper face of the circuit 1 may, if desired, be provided with connections made in standard manner.

Figure 7:
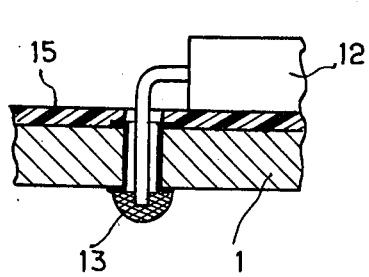
FIGS. 7 and 8 show in cross-section the manner in which discrete components may be assembled on the finished printed circuit.
Figure 8:
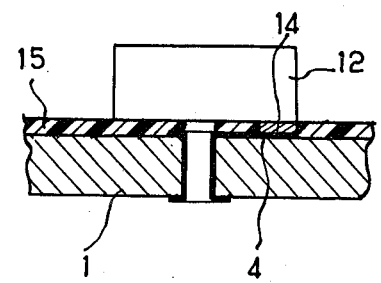

Discrete components 12 may be mounted in a standard manner on both faces of circuit 1 and fixed by welding 13, as shown in FIG. 7. If these components are to be fixed by glueing with the aid of conductive resin 14, the corresponding foils 4 are allowed to remain exposed when the insulating layers 5, 7 and 9 are formed, as may be seen in FIG. 8. In FIGS. 7 and 8, the group constituted by layers 4, 7, 9 and 11 is shown at 15.

Figure 9:
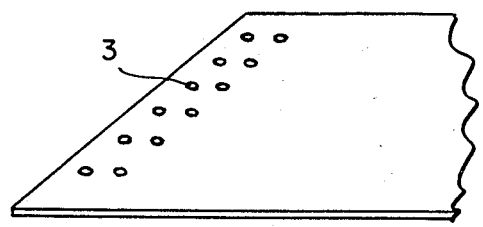
FIG. 9 is a view of an alternative, similar to FIG. 5.

If the upper face of the circuit 1 is to have only connection or external cabling holes and has not to be fitted with discrete components, the holes 3 connected to the foils 4 interconnected together may be sealed by the insulating layers 5, 7 and 9, as shown in FIG. 9.

Instead of being formed by a silk screen process, the connections 6, 8 and 10 may be made by deposition of a bead of extruded resin from a container containing the resin. Extrusion permits using digitally-controlled automatic machines. In a first stage, a first nozzle deposits the conductive resin from one foil 4 to another along a path which may be curved. At a second stage, a second nozzle deposits the insulating coating along the same path, but extrusion does not begin till the nozzle is outside the initial foil and stops immediately before the last foil is reached.

It is obvious that the present invention is not to be regarded as limited to the embodiment described and represented but, on the contrary, covers all the alternatives thereof.

What is claimed is:

1. A method of making a printed circuit which comprises the steps of:
   (a) applying to an electrically insulating substrate formed with metallized holes and conductive zones upon a surface of the substrate a first insulation layer through which portions of said zones are exposed;
   (b) applying over said first insulating layer beads of electrically conductive hardenable synthetic-resin material bridging at least some of said zones to electrically interconnect the same;
   (c) hardening said beads of synthetic-resin material;
   (d) applying over the hardened beads while leaving at least some of said holes exposed, a second layer of electrically insulating material; and
   (e) mounting circuit board components above said second layer with leads extending into and soldered to said holes.

2. The method defined in claim 1 wherein others of said zones are left exposed by said second layer, said method further comprising the steps of:
   (f) applying over said second layer further beads of said hardenable electrically conductive synthetic-resin to bridge further ones of said zones left exposed by said second layer prior to the application of said components;
   (g) hardening said further beads; and
   (h) applying a third layer of electrically insulating material over the beads hardened in step (g), said components being mounted upon said third layer in step (d).

3. A printed circuit assembly comprising:
   (a) an electrically insulating board formed with metallized holes and electrically conductive zones upon a surface of said board;
   (b) a first layer of insulating material overlying the surface of said board provided with said zones and leaving at least some of said zones exposed;
   (c) a plurality of beads of hardened conductive synthetic resin overlying said first layer and electrically interconnecting at least some of the zones left exposed by said first layer;
   (d) a second electrically insulating layer overlying said beads and said first layer; and
   (e) circuit components mounted above said second layer and having leads extending into and soldered to said holes.

4. The assembly defined in claim 3 wherein said second layer leaves others of said zones exposed, said assembly further comprising:
   (f) further beads of hardened electrically conductive synthetic-resin bridging zones exposed by said second layer and electrically interconnecting same; and
   (g) a third layer of insulating material overlying the further beads, said components being mounted on said third layer.

* * * * *